United States Patent
Matsuoka et al.

(10) Patent No.: US 8,435,882 B2
(45) Date of Patent: May 7, 2013

(54) FILM FORMING METHOD FOR A SEMICONDUCTOR

(75) Inventors: Takaaki Matsuoka, Minato-ku (JP); Kohei Kawamura, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 132 days.

(21) Appl. No.: 12/452,784

(22) PCT Filed: Jul. 24, 2008

(86) PCT No.: PCT/US2008/009044
§ 371 (c)(1),
(2), (4) Date: Jan. 22, 2010

(87) PCT Pub. No.: WO2009/014748
PCT Pub. Date: Jan. 29, 2009

(65) Prior Publication Data
US 2010/0117204 A1    May 13, 2010

Related U.S. Application Data

(60) Provisional application No. 60/961,942, filed on Jul. 25, 2007.

(51) Int. Cl.
*H01L 21/4763* (2006.01)
(52) U.S. Cl.
USPC ........... 438/624; 438/625; 438/761; 257/635; 257/637; 257/640; 257/E21.24
(58) Field of Classification Search .................. 438/624, 438/625, 761; 257/635, E21.24, 637, 640
See application file for complete search history.

(56) References Cited

U.S. PATENT DOCUMENTS

| | | | | |
|---|---|---|---|---|
| 6,657,284 B1* | 12/2003 | Li et al. | | 257/649 |
| 6,764,939 B1* | 7/2004 | Yoshitaka | | 438/624 |
| 6,856,019 B2* | 2/2005 | Tamaru et al. | | 257/758 |
| 7,033,940 B1* | 4/2006 | Marathe et al. | | 438/687 |
| 7,144,803 B2* | 12/2006 | Engbrecht et al. | | 438/622 |
| 7,323,781 B2* | 1/2008 | Noguchi et al. | | 257/758 |
| 7,915,166 B1* | 3/2011 | Yu et al. | | 438/687 |
| 2003/0030146 A1* | 2/2003 | Tamaru et al. | | 257/762 |
| 2006/0003572 A1* | 1/2006 | Chen et al. | | 438/622 |

FOREIGN PATENT DOCUMENTS

| JP | 2000-074127 A | 3/2000 |
|---|---|---|
| JP | 2005-064302 A | 3/2005 |
| JP | 2005-064302 A | 3/2005 |
| JP | 2005-093737 A | 4/2005 |
| JP | 2005-150612 A | 6/2005 |
| JP | 200673569 A | 3/2006 |

(Continued)

OTHER PUBLICATIONS

Korean Patent Office, Office Action issued on May 25, 2011, for corresponding Korean patent application No. 10-2010-7001702, 11 pages.

(Continued)

*Primary Examiner* — Thinh T Nguyen

(57) ABSTRACT

The present invention may be a semiconductor device including of a fluorinated insulating film and a SiCN film deposited on the fluorinated insulating film directly, wherein a density of nitrogen in the SiCN film decreases from interface between the fluorinated insulating film and the SiCN film. In the present invention, the SiCN film that is highly fluorine-resistant near the interface with the CFx film and has a low dielectric constant as a whole can be formed as a hard mask.

13 Claims, 4 Drawing Sheets

FOREIGN PATENT DOCUMENTS

| | | |
|---|---|---|
| JP | 2005-223360 A | 5/2006 |
| JP | 2006-128591 A | 5/2006 |
| JP | 2006-128591 A | 5/2006 |
| JP | 2006-324023 A | 11/2006 |

OTHER PUBLICATIONS

Chinese Patent Office, Office Action issued on Apr. 25, 2011, for corresponding Chinese patent application No. 200880100328.3, 39 pages.

Chinese Patent Office, Office Action issued on Apr. 23, 2012, for corresponding Chinese patent application No. 200880100328.3, 7 pages.

Japanese Patent Office, Office Action issued on Oct. 30, 2012, for corresponding Japanese patent application No. P2010-518232, 2 pages.

* cited by examiner

FILM FORMING METHOD FOR A SEMICONDUCTOR

This application claims priority to U.S. Provisional Application Ser. No. 60/961,942, filed on Jul. 25, 2007, entitled "Method for Semiconductor Deposition", which is incorporated herein by reference in its entirety.

TECHNICAL FIELD

The present invention relates to a method for forming a film on a substrate. The method is applicable to semiconductor devices, liquid crystal display devices, and organic EL elements.

BACKGROUND OF THE INVENTION

In a manufacturing process for electronic devices, such as semiconductor devices, liquid crystal display devices, and organic electro-luminescent (EL) elements, a film forming process is performed to form a conductive film or an insulating film on the surface of a substrate. A plasma film forming process for forming a film on a substrate using a plasma is employed in this film forming process. In a case when forming a CF film on a substrate, and further forming an insulating film on the CF film in the film forming process, there has been a problem that the fluorine atom in the CF film diffuses in the insulating film, thereby the contactablity of the CF film and the insulating film decreases. Also, there has been a problem that the insulation film may peel off due to corrosion of the insulating film by the fluorine atom diffused in the insulating film when the CF film and the insulating film are heat treated at a subsequent film forming process.

By the way, the above plasma film forming process is normally performed by a plasma film forming apparatus. In recent years, a microwave plasma film forming apparatus, which forms a film by generating a plasma by a microwave field, has been attracting attention as a type of plasma film forming apparatus. According to this microwave plasma film forming apparatus, high-density plasma compared to the conventional film forming apparatus can be obtained, thereby the film forming process to the substrate can be performed effectively in a short time.

The microwave plasma film forming apparatus described above is provided with, for example, a placing base to place a substrate inside a treatment vessel. And on the upper portion of the treatment vessel, provided are radial line slot antennas, and a shower plate to pass through the microwave from the radial line antennas, and to supply gas for plasma excitation. Further, the microwave plasma film forming apparatus employs a supply material gas for film from the wall surface of the treatment vessel.

As a plasma processing method for forming a film using the microwave plasma film forming apparatus, for example, the following has been known. For example, Japanese Published Unexamined Patent Application No. 2005-093737 discloses a plasma processing method for forming a film on a substrate which is capable of forming a high quality film with a low temperature in a short time by optimizing the amounts of radicals and ions supplied to the substrate. Also, Japanese Published Unexamined Application No. 2006-324023 discloses a plasma film forming device capable of minimizing deformation or distortion of the shower plate by maintaining the temperature of the shower plate to a desired temperature, and improving the uniformity of an in-plane temperature of the shower plate.

Also, Japanese Published Unexamined Patent Application No. 2005-150612 discloses a plasma film forming apparatus which prevents the gas for plasma excitation from plasmanizing before it is supplied to the treatment vessel, and appropriately generates a plasma within the area of a high-frequency wave supplying side, that is, a plasma generating area. Further, International Published Unexamined Patent Application No. 2000-74127 discloses a plasma process apparatus capable of maintaining the stability of the plasma regardless of the type of gas used for the process because there is no film attachment on the surface of the dielectric shower plate of the microwave introduction part due to dissociation or binding of the gas for processing.

However, by using any of the methods described in the documents above, improvement in the heat resistance of the film formed on the substrate, or prevention of the excessive disassociation of the film could not be achieved sufficiently. As a result, there has been a problem with a deterioration in the contactablity between the films formed on the substrate. Also, with respect to the film formed on the substrate, there has been a demand for the characteristics capable of functioning in various conditions. Further, with respect to manufacturing costs, omission of a manufacturing process and reduction of the material cost has been desired.

SUMMARY OF THE INVENTION

One aspect of the present invention is a semiconductor device including of a fluorinated insulating film and a SiCN film deposited on the fluorinated insulating film directly, wherein a density of nitrogen in the SiCN film decreases from interface between the fluorinated insulating film and the SiCN film.

The density of nitrogen may decrease gradually. The SiCN film may be produced by reacting a plasma gas in a container separated into a plurality of areas. The SiCN film may be produced by adjusting a flow ratio of gas into the plurality of areas.

The flow ratio of forming an interior of the SiCN film may be different from the flow ratio of forming an exterior of the SiCN film. The container may include an upper area and a lower area, and the amount of gas flowing into the upper area may be greater than the amount of gas flowing into the lower area when forming the exterior of the SiCN film.

The container may include an upper area and a lower area, and the amount of gas flowing into the lower area may be greater than the amount of gas flowing into the upper area when forming the interior of the SiCN film. An additive gas may be flowed into the upper area and a material gas may be flowed into the lower area. The flow ratio of gas may be adjusted with time.

In the present invention, the SiCN film that is highly fluorine-resistant near the interface with the CFx film and has a low dielectric constant as a whole can be formed as a hard mask.

In a case when the method described above is used for further forming a film on the film formed on the substrate, thus excessive disassociation of the film can be prevented and the heat resistance of the film formed on the substrate can be improved. Also, the film formed by using the method described above significantly improves heat resistance (allowable temperature limit).

Further, by using the method described above, a film with various characteristics can be formed. Also, by using the method described above, a film having various constitutional components can be formed. Thus, the characteristics of the film and the constitutional components can be controlled.

Further, in a case when the same type of gases are used in the method described above, the conditions of disassociation for both are different. As a result, the gas components, if different types of gases are utilized, may coexist in the area. Therefore, low-cost gases may be utilized instead of high cost gases. And, the film with a construction similar to that of the film formed by using high-cost gas, can be formed.

By adjusting the flow ratio of gases with time by utilizing the method described above, a film with more characteristics and a film having more constitutional components can be formed. Thereby the characteristics of the film and the constitutional components of the film can be controlled more effectively. Also, the manufacturing cost can be reduced by utilizing a low-cost material instead of a high-cost material.

By using the method described above to change the flow ratio of gases, the film superficial composition and interior composition can be changed. For example, when the film superficial structure is high in dielectric constant and mechanical strength, however, the film interior structure may be configured to a structure relatively low in mechanical strength and low in dielectric constant. Further, in order to increase the mechanical strength or the thermal strength of the film, a post film forming process called cure is generally used for a Low k material, however, such a process can be eliminated by using the method described above.

DETAILED DESCRIPTION OF THE INVENTION

Figure 1:
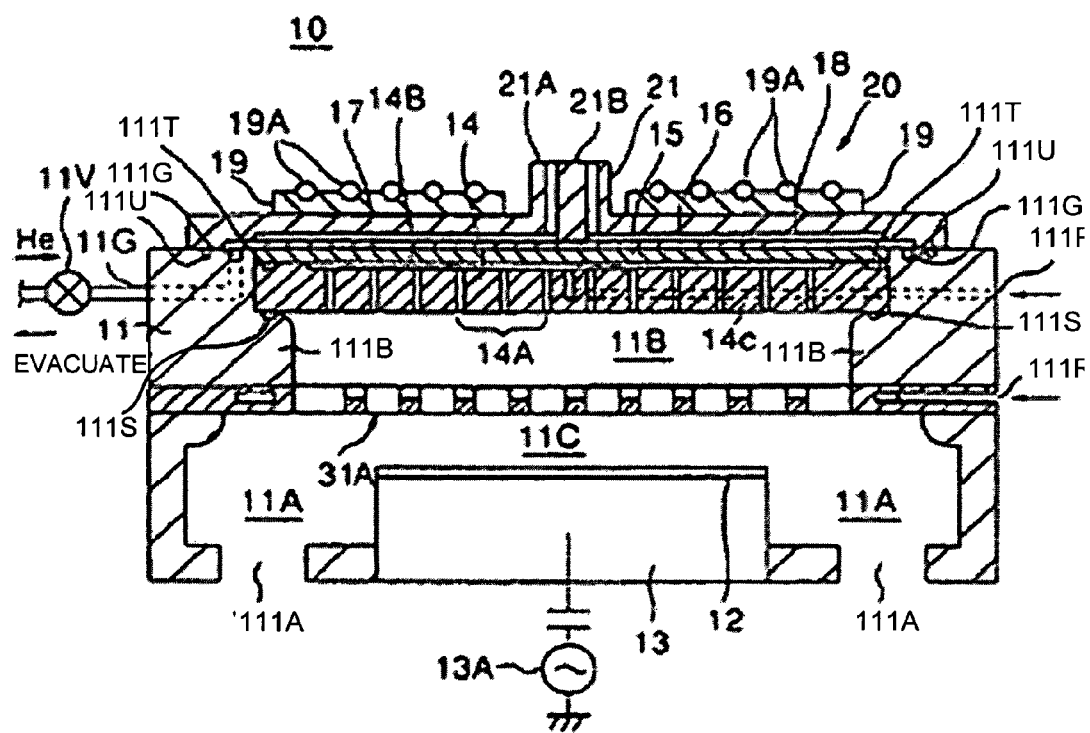
FIGS. 1 and 2 are diagrams showing a structure of a microwave plasma processing apparatus according to a first embodiment of the present invention.
Figure 2:
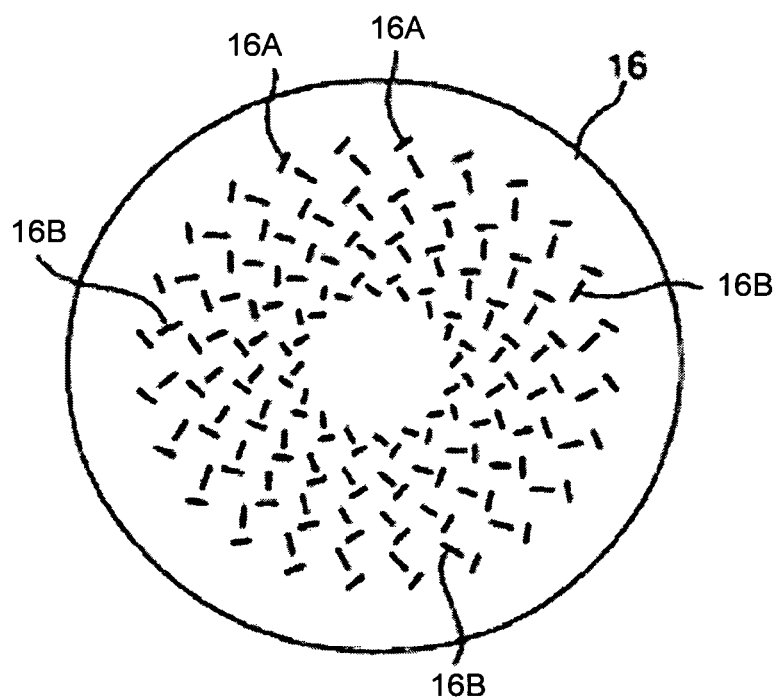

A CVD apparatus for generating a plasma using RLSA is hereinafter explained. FIGS. 1 and 2 are diagrams showing a construction of a microwave plasma processing apparatus 10 according to a first embodiment of the present invention.

Referring to FIG. 1, the microwave plasma processing apparatus 10 includes a processing vessel 11 and a stage 13 provided in the processing vessel 11 for holding a substrate 12 to be processed by an electrostatic chuck, wherein the stage 13 is preferably formed of AlN or $Al_2O_3$ by a hot isostatic pressing (HIP) process. In the processing vessel 11, there are formed at least two or preferably more than or equal to three evacuation ports 111A in a space 11A surrounding the stage 13 with an equal distance, and hence with an axial symmetry with respect to the substrate 12 on the stage 13. The processing vessel 11 is evacuated to a low pressure via the evacuation port 111A by a gradational lead screw pump to be explained later.

The processing vessel 11 is preferably formed of an austenite stainless steel containing Al, and there is formed a protective film of aluminum oxide on the inner wall surface by an oxidizing process. Further, there is formed a disk-like shower plate 14 of dense $Al_2O_3$, formed by a HIP process, in the part of the outer wall of the processing vessel 11 corresponding to the substrate 12 as a part of the outer wall, wherein the shower plate 14 includes a large number of nozzle apertures 14A. The $Al_2O_3$ shower plate 14 thus formed by a HIP process is formed by using an $Y_2O_3$ additive and has porosity of 0.03% or less. This means that the $Al_2O_3$ shower plate is substantially free from pores or pinholes and has a very large, while not so large as that of AlN, thermal conductivity for a ceramic of 30 W/mK.

The shower plate 14 is mounted on the processing vessel 11 via a seal ring 111S, and a cover plate 15 of dense $Al_2O_3$ formed also of an HIP process is provided on the shower plate 14 via a seal ring 111T. The shower plate 14 is formed with a depression 14B communicating with each of the nozzle apertures 14A that serve as the plasma gas passage, at the side thereof contacting with the cover plate 15, wherein the depression 14B also communicates with another plasma gas passage 14C formed in the interior of the shower plate 14 in communication with a plasma gas inlet 111P formed on the outer wall of the processing vessel 11.

The shower plate 14 is held by an extending part 111B formed on the inner wall of the processing vessel 11, wherein the extending part 111B is formed with a round surface at the part holding the shower plate 14 so as to suppress an electric discharge.

Thus, a gas for plasma excitation such as Ar or Kr supplied to the plasma gas inlet 111P is supplied to a space 11B right underneath the shower plate 14 uniformly via the apertures 14A after being passed through the passages 14C and 14B in the shower plate 14.

On the cover plate 15, there is provided a radial line slot antenna 20 formed of a disk-like slot plate 16 formed with a number of slots 16A and 16B shown in FIG. 2 in intimate contact with the cover plate 15, a disk-like antenna body 17 holding the slot plate 16, and a retardation plate 18 of a dielectric material of low loss such as $Al_2O_3$, $SiO_2$ or $Si_3N_4$ sandwiched between the slot plate 16 and the antenna body 17. The radial line slot antenna 20 is mounted on the processing vessel 11 by way of a seal ring 111U, and a microwave of 2.45 GHz or 8.3 GHz frequency is fed to the radial line slot antenna 20 from an external microwave source (not shown) via a coaxial waveguide 21. The microwave thus supplied is radiated into the interior of the processing vessel from the slots 16A and 16B on the slot plate 16 via the cover plate 15 and the shower plate 14. Thereby, the microwave causes excitation of plasma in the plasma gas supplied from the apertures 14A in the space 11B right underneath the shower plate 14. It should be noted that the cover plate 15 and the shower plate 14 are formed of $Al_2O_3$ and function as an efficient microwave-transmitting window. In order to avoid plasma excitation in the plasma gas passages 14A-14C, the plasma gas is held at the pressure of about 6666 Pa-13332 Pa (about 50-100 Torr) in the foregoing passages 14A-14C.

In order to improve intimate contact between the radial line slot antenna 20 and the cover plate 15, the microwave plasma processing apparatus 10 of the present embodiment has a ring-shaped groove on a part of the processing vessel 11 so as to engage with the slot plate 16. By evacuating the groove via an evacuation port 11G communicating therewith, the pressure in the gap formed between the slot plate 16 and the cover plate 15 is reduced and the radial line slot antenna 20 is urged firmly upon the cover plate 15 by the atmospheric pressure. It should be noted that such a gap includes not only the slots 16A and 16B formed in the slot plate 16 but also a gap formed by other various reasons. It should be noted further that such a gap is sealed by the seal ring 111U provided between the radial line slot antenna 20 and the processing vessel 11.

By filling the gap between the slot plate 16 and the cover plate 15 with an inert gas of small molecular weight via the evacuation port 11G and the groove 111G, heat transfer from the cover plate 15 to the slot plate 16 is facilitated. Thereby, it is preferable to use He for such an inert gas in view of the large thermal conductivity and the large ionization energy. In a case when the gap is filled with He, it is preferable to set the pressure to about 0.8 atm. In the construction of FIG. 1, there is provided a valve 11V on the evacuation port 11G for the evacuation of the groove 111G and filling of the inert gas into the groove 111G.

It should be noted that an outer waveguide tube 21A of the coaxial waveguide 21 is connected to the disk-like antenna body 17 while a central conductor 21B is connected to the slot plate 16 via an opening formed in the retardation plate 18. Thus, the microwave fed to the coaxial waveguide 21 is propagated in the radial direction between the antenna body 17 and the slot plate 16 and is emitted from the slots 16A and 16B.

FIG. 2 shows the slots 16A and 16B formed on the slot plate 16. Referring to FIG. 2, the slots 16A are arranged in a concentric manner such that there is provided a slot 16B for each slot 16A such that the slot 16B crosses the slot 16A perpendicularly and such that the slot 16B is aligned concentrically with the slot 16A. The slots 16A and 16B are formed with an interval corresponding to the wavelength of the microwave compressed by the radiation plate 18 in the radial direction of the slot plate 16, and as a result, the microwave is radiated from the slot plate 16 in the form of a near plane wave. Because the slots 16A and the slots 16B are formed in the mutually perpendicular relationship, the microwave thus radiated forms a circularly polarized wave including two perpendicular polarization components.

In the plasma processing apparatus 10 of FIG. 1, there is provided a coolant block 19 formed with a coolant water passage 19A on the antenna body 17, and the heat accumulated in the shower plate 14 is absorbed via the radial line slot antenna 20 by cooling the coolant block 19 by the coolant water in the coolant water passage 19A. The coolant water passage 19A is formed on the coolant block 19 in a spiral form, and coolant water having a controlled oxidation-reduction potential is supplied thereto, wherein the control of the oxidation reduction potential is achieved by eliminating oxygen dissolved in the coolant water by way of bubbling of an $H_2$ gas.

In the microwave plasma processing apparatus 10 of FIG. 1, there is further provided a process gas supply mechanism 31 in the processing vessel 11 between the shower plate 14 and the substrate 12 on the stage 13, wherein the process gas supply mechanism 31 has gas passages 31A arranged in a lattice shape and releases a process gas supplied from a process gas inlet port 111R provided on the outer wall of the processing vessel 11 through a large number of process gas nozzle apertures. Thereby, desired uniform substrate processing is achieved in a space 11C between the process gas supply structure 31 and the substrate 12. Such substrate processing includes plasma oxidation processing, plasma nitridation processing, plasma oxynitridation processing, and plasma CVD processing. Further, it is possible to conduct a reactive ion etching of the substrate 12 by supplying a readily decomposing fluorocarbon gas such as $C_4F_8$, $C_5F_8$ or $C_4F_6$ or an etching gas containing F or Cl and further by applying a high-frequency voltage to the stage 13 from a high-frequency power source 13A.

In the microwave plasma processing apparatus 10 of the present embodiment, it is possible to avoid deposition of reaction byproducts on the inner wall of the processing vessel by heating the outer wall of the processing vessel 11 to a temperature of about 150° C. Thereby, the microwave plasma processing apparatus 10 can be operated constantly and with reliability, by merely conducing a dry cleaning process once a day or so.

Figure 3:
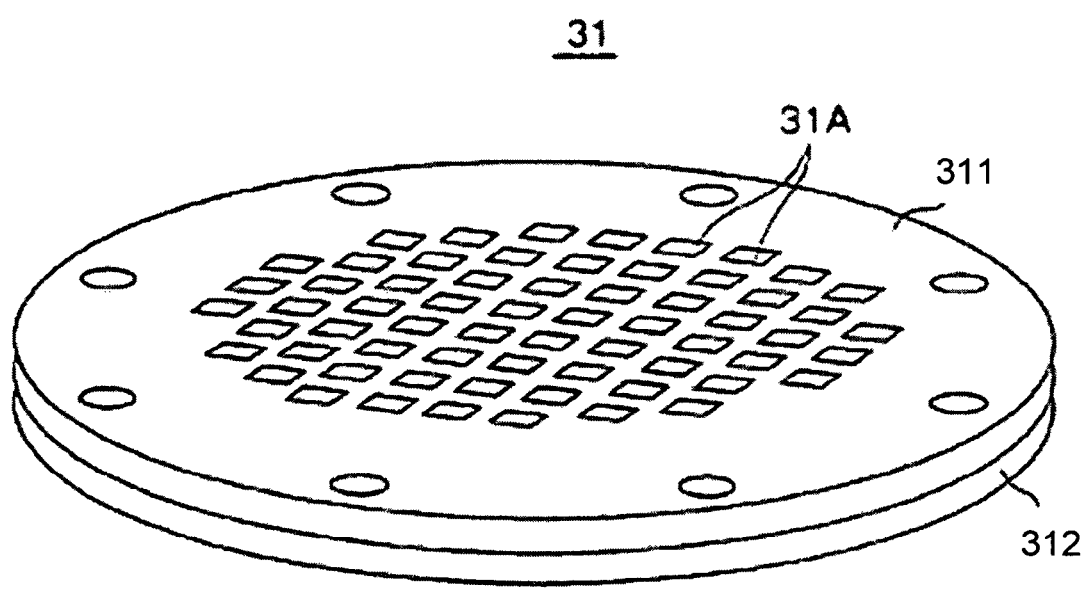
FIG. 3 is a perspective view showing a structure of a process gas supply mechanism of the microwave plasma processing apparatus of FIGS. 1 and 2.

FIG. 3 is a prospect view showing a structure of the process gas supply mechanism 31 of FIG. 1. Referring to FIG. 3, the process gas supply mechanism 31 is formed in a stack of disk-like conductive members 311 and 312 such as an Al alloy containing Mg or a stainless steel added with Al. There is provided apertures 31A disposed in a matrix form to serve for a plasma gas passage. For example, the aperture 31A has a size of 19 mm×19 mm and is provided iteratively at a pitch of 24 mm both in the row direction and in the column direction. The process gas supply mechanism 31 has a total thickness of about 8.5 mm and is typically mounted with a separation of about 16 mm from the surface of the substrate 12.

Figure 4:
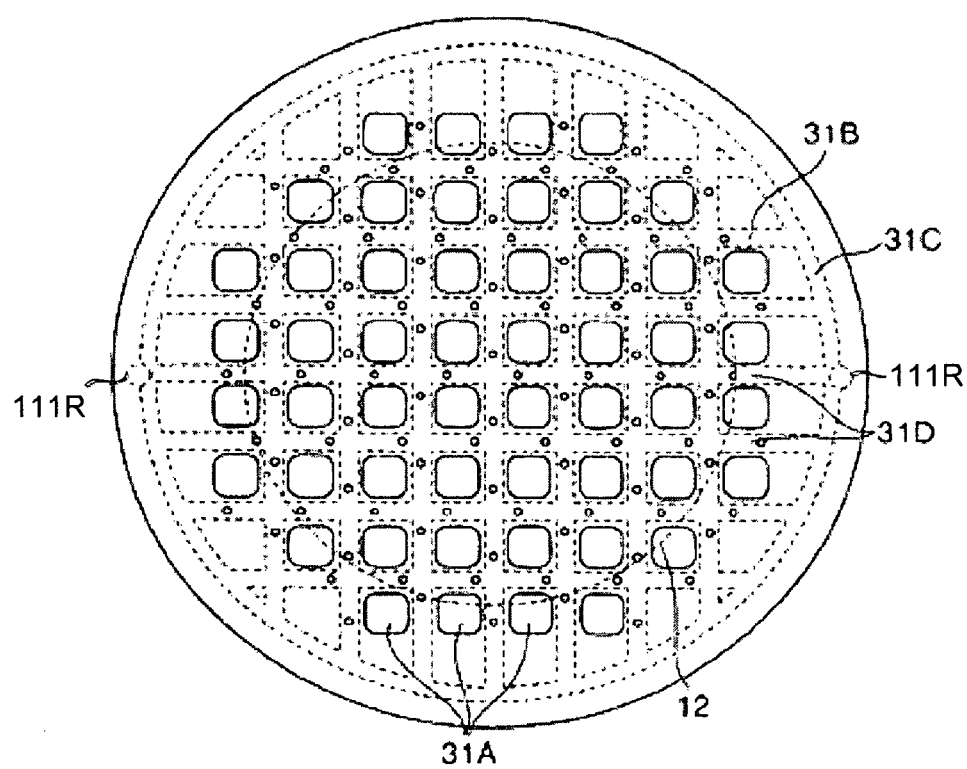
FIG. 4 is a bottom view showing a disk-like conductive body constituting a portion of the process gas supply mechanism in FIG. 3.

FIG. 4 is a bottom diagram showing a structure of the disk-like conductive member 311 in FIG. 3. Referring to FIG. 4, in the disk-like conductive member 311, there is provided a lattice-shaped process gas passage 31B in communication with the process gas supply passage 31C formed along an outer circumference of the disk-like conductive member 311 represented by a broken line in FIG. 4. The process gas supply passage 31C is connected to the process gas inlet port 111R. In the opposite surface of the disk-like conductive member 311, there are formed a large number of process gas nozzle apertures 31D in communication with the process gas passage 31B. The process gas is released from the process gas nozzle apertures 31D to the disk-like conductive member 312.

The embodiment in which the microwave plasma processing apparatus 10 according to the present invention is used to form a film on a substrate is described a little more by taking a specific example. In the present invention, by changing flow ratios of gases to be introduced into the space 11B and space 11C in the microwave plasma processing apparatus 10, films having different molecular composition ratios can be laminated. For example, if trimethylsilane and nitrogen gas are introduced into both of the space 11B and space 11C, a SiCN hard mask is formed on the substrate; however, in this case, if the flow ratios in the space 11B and space 11C are changed between the time of film formation for an interface region and that for a film region, the SiCN film of which a molecular composition ratio is different between the interface and film regions can be formed.

Typically, a CFx film or the like is laminated on the substrate, onto which a SiCN film is laminated; however, for example, when the lamination of the SiCN, film onto the CFx film is started (at the time of film formation for the interface region), a flow rate to the space 11B is made larger than that to the space 11C, whereas at the time of film formation for the film region, the flow rate to the space 11C is made larger than that to the space 11B. Configuring in this manner allows percentages of Si—N bonds and Si—C bonds to be increased near the interface and in the film, respectively, as compared with the case of the film formation at a flow ratio of 1:1. Near the interface of the CFx film, to increase adhesiveness between the CFx and SiCN films, the SiCN film having high fluorine-resistance is preferable. The SiCN film having a large percentage of Si—N bonds is a highly fluorine-resistant film, and therefore it is preferable to form the film through the above processing. On the other hand, the SiCN having the large percentage of Si—N bonds has a larger dielectric constant as compared with the SiCN film having a large percentage of Si—C bonds. Accordingly, in a region other than the near-interface region, i.e., in the film region, the SiCN film having the large percentage of Si—C bonds is preferable, and therefore it is preferable to form the film through the above processing. By employing such method, the SiCN film that is highly fluorine-resistant near the interface with the CFx film and has a low dielectric constant as a whole can be formed as a hard mask.

The gases to be introduced into the above-described space 11B and space 11C are not particularly limited as described above, but any type of gas can be introduced. Typically, into the space 11B, gas such as argon (Ar), nitrogen gas ($N_2$), ammonia gas ($NH_3$), or hydrogen gas can be introduced, whereas, into the space 11C, a gas mixture of trimethylsilane and nitrogen gas, silane, disilane, methylsilane (such as monomethylsilane, dimethylsilane, trimethylsilane, or tetramethylsilane), silazane (such as methylsilazane or ethylsilazane), or the like can be introduced. If it is desired to form the SiCN film onto the substrate, argon gas and a gas mixture of trimethylsilane and nitrogen gas are preferably introduced into the space 11B and space 11C, respectively. On the other hand, if it is desired to form the SiC film onto the substrate, argon gas and trimethylsilane are preferably introduced into the space 11B and space 11C, respectively. Further, if it is desired to form a SiN film onto the substrate, argon gas, and silane or disilane are preferably introduced into the space 11B and space 11C, respectively. Also, even if nitrogen gas and trimethylsilane are respectively introduced into the space 11B and space 11C, the SiCN film can be formed.

Even if the SiCN, SiC, or SiN film is formed on the basis of a corresponding one of the above methods, by changing the gas flow ratios in the space 11B and space 11C, the films having different molecular composition ratios can be formed. Note that the term "dissociation" is used above, however, this does not mean that film components in a formed film are dissociated, but means that gases having been introduced into the space 11B or space 11C are brought into the dissociated condition upon reaction of the gases, under which the film is formed on the basis of the reaction.

One embodiment of the present invention is explained above, however, the present invention is not limited to the above specific example. For example, a film is formed on a substrate, however, the method for forming a film according to the present invention may be applied for forming other films, such as an electrode film. Also, other gases, such as xenon gas, or krypton gas, may be utilized as the gas supplied from the shower plate 14. Further, the method for forming a film according to the present invention can be applied not only to the substrate of the semiconductor device, but also, for example, to the substrates for manufacturing liquid crystal display devices or organic EL elements.

The substrate processing related to the present invention includes, for example, plasma oxidation processing, plasma nitridation processing, plasma oxynitridation processing, plasma CVD processing, and the like. The microwave plasma processing apparatus 10 according to the present embodiment can avoid the deposition of the reaction byproducts and the like onto the inner wall of the above-described processing vessel 11 by heating the outer wall of the treatment vessel at a temperature of approximately 150° C., and can be constantly stably operated by dry cleaning around once a day.

What is claimed is:

1. A method for manufacturing a semiconductor device having a fluorinated insulating film, said method comprising the steps of:
   depositing a SiCN film on the fluorinated insulating film, wherein a density of nitrogen in the SiCN film decreases in accordance with a distance from an interface between the fluorinated insulating film and the SiCN film, and
   a percentage of Si—N bonds in a first region that is a region in the SiCN film and in a vicinity of the interface between the insulating film and the SiCN film is larger than a percentage of Si—N bonds in a second region that is a region other than the first region in the SiCN film, and a percentage of Si—C bonds in the second region is larger than a percentage of Si—C bonds in the first region.

2. The method for manufacturing a semiconductor device of claim 1, wherein the SiCN film is produced by adjusting a flow ratio of gas into a plurality of areas into which a processing vessel for manufacturing the semiconductor device has been divided.

3. The method for manufacturing a semiconductor device of claim 2, wherein the flow ratio is adjusted in accordance with time.

4. The method for manufacturing a semiconductor device of claim 3, wherein the plurality of areas are structured by an upper area and a lower area, and an amount of gas flowing into the upper area is greater than an amount of gas flow into the lower area when forming an exterior of the SiCN film.

5. The method for manufacturing a semiconductor device of claim 3, wherein the plurality of areas are structured by an upper area and a lower area, and an amount of gas flowing into the lower area is greater than an amount of gas flowing into the upper area when forming an interior of the SiCN film.

6. A method for manufacturing a semiconductor device having a fluorinated insulating film, said method comprising the steps of:
   forming a SiCN film on the fluorinated insulating film by exciting nitrogen gas and gas including silicon and carbon by a microwave; and
   changing a flow rate of the nitrogen gas in the SiCN film so as to obtain the SiCN film having a nitrogen density that decreases in accordance with a distance from an interface between the fluorinated insulating film and the SiCN film, and
   a percentage of Si—N bonds in a first region that is a region in the SiCN film and in a vicinity of the interface between the insulating film and the SiCN film is larger than a percentage of Si—N bonds in a second region that is a region other than the first region in the SiCN film, and a percentage of Si—C bonds in the second region is larger than a percentage of Si—C bonds in the first region.

7. A semiconductor device having an insulating film including fluorine, comprising:
   a SiCN film directly deposited on the insulating film,
   wherein a density of nitrogen in the SiCN film decreases from an interface between the insulating film and the SiCN film, and
   a percentage of Si—N bonds in a first region that is a region in the SiCN film and in a vicinity of the interface between the insulating film and the SiCN film is larger than a percentage of Si—N bonds in a second region that is a region other than the first region in the SiCN film, and a percentage of Si—C bonds in the second region is larger than a percentage of Si—C bonds in the first region.

8. The semiconductor device of claim 7, wherein the density of nitrogen in the SiCN film decreases gradually in accordance with a distance from the interface between the fluorinated insulating film and the SiCN film.

9. The semiconductor device of claim 7, wherein the SiCN film has a higher dielectric constant near the interface between the fluorinated insulating film and the SiCN film than at a distance from the interface between the fluorinated insulating film and the SiCN film.

10. The method for manufacturing a semiconductor device of claim 1, wherein the density of nitrogen in the SiCN film decreases gradually in accordance with a distance from the interface between the fluorinated insulating film and the SiCN film.

11. The method for manufacturing a semiconductor device of claim 1, wherein the SiCN film has a higher dielectric constant near the interface between the fluorinated insulating film and the SiCN film than at a distance from the interface between the fluorinated insulating film and the SiCN film.

12. The method for manufacturing a semiconductor device of claim 6, wherein the density of nitrogen in the SiCN film decreases gradually in accordance with a distance from the interface between the fluorinated insulating film and the SiCN film.

13. The method for manufacturing a semiconductor device of claim 6, wherein the SiCN film has a higher dielectric constant near the interface between the fluorinated insulating film and the SiCN film than at a distance from the interface between the fluorinated insulating film and the SiCN film.

* * * * *